United States Patent
Schiavoni et al.

(10) Patent No.: US 9,340,453 B2
(45) Date of Patent: May 17, 2016

(54) TRANSPARENT GLASS SUBSTRATE AND PROCESS FOR MANUFACTURING SUCH A SUBSTRATE

(75) Inventors: Michele Schiavoni, Paris (FR); Marcus Neander, Eschweiler (DE); Pascal Roemgens, Herzogenrath-Merkstein (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 1190 days.

(21) Appl. No.: 13/145,379

(22) PCT Filed: Jan. 22, 2010

(86) PCT No.: PCT/FR2010/050097
§ 371 (c)(1),
(2), (4) Date: Jul. 20, 2011

(87) PCT Pub. No.: WO2010/084290
PCT Pub. Date: Jul. 29, 2010

(65) Prior Publication Data
US 2011/0281078 A1  Nov. 17, 2011

(30) Foreign Application Priority Data
Jan. 23, 2009 (FR) ..................................... 09 50422

(51) Int. Cl.
*B32B 3/00* (2006.01)
*B32B 3/30* (2006.01)
(Continued)

(52) U.S. Cl.
CPC ............... *C03C 23/008* (2013.01); *C03B 13/08* (2013.01);
(Continued)

(58) Field of Classification Search
CPC ............ B32B 3/00; B32B 3/30; B32B 17/06; B32B 17/10018; B32B 17/10128; B32B 17/10146; C03C 23/00; C03C 23/008; C03C 2204/08; C03B 13/08; Y02E 10/40; Y02E 10/50; Y10T 428/2457; Y10T 428/24612
USPC ......... 428/141, 145, 149, 156, 167, 172, 426, 428/428, 429; 65/31
See application file for complete search history.

(56) References Cited

U.S. PATENT DOCUMENTS 2,490,662 A     12/1949 Thomsen
5,120,605 A *   6/1992 Zuel et al. .................. 428/410
(Continued)

FOREIGN PATENT DOCUMENTS

FR  WO03046617 A1 *  6/2003
FR  2 908 406         5/2008

OTHER PUBLICATIONS

Garnier, A., "Le verre : un materiau de choix pour la technologie photovoltaique," Institut Du Verre, vol. 14, No. 6, pp. 22-29, (Dec. 2008) XP 001548221.
(Continued)

*Primary Examiner* — Catherine A Simone
(74) *Attorney, Agent, or Firm* — Oblon, McClelland, Maier & Neustadt, L.L.P.

(57) ABSTRACT

This transparent glass substrate has at least one face which is provided with a texturing formed by a plurality of geometric features in relief relative to a general plane of the face, this texturing being adapted in order to ensure a transmission of radiation through the substrate greater than the transmission of radiation through a substrate that is identical but lacks texturing. The face of the substrate is also provided with an antireflection layer having a refractive index between the refractive index of air and the refractive index of the glass. The antireflection layer is an etched out superficial portion of the glass substrate on the side of the face, which comprises a structure based on silica and voids having a characteristic dimension between 0.5 nanometers and 50 nanometers.

16 Claims, 3 Drawing Sheets

(51) Int. Cl.
  *B32B 17/06* (2006.01)
  *C03C 23/00* (2006.01)
  *C03B 13/08* (2006.01)
  *F24J 2/50* (2006.01)
  *H01L 31/0236* (2006.01)
  *H01L 31/0392* (2006.01)

(52) U.S. Cl.
  CPC ............. *F24J 2/505* (2013.01); *H01L 31/0236* (2013.01); *H01L 31/0392* (2013.01); *C03C 2204/08* (2013.01); *Y02E 10/40* (2013.01); *Y02E 10/50* (2013.01); *Y02P 40/57* (2015.11); *Y10T 428/2457* (2015.01); *Y10T 428/24612* (2015.01)

(56) References Cited

U.S. PATENT DOCUMENTS

| | | |
|---|---|---|
| 5,326,720 A | 7/1994 | Goda |
| 6,929,861 B2 * | 8/2005 | Lin ............................... 428/410 |
| 7,368,655 B2 | 5/2008 | Blieske |
| 2001/0051259 A1 | 12/2001 | Ponjee |
| 2004/0086716 A1 | 5/2004 | Weikinger |
| 2004/0234799 A1 | 11/2004 | Bohm et al. |
| 2010/0101649 A1 | 4/2010 | Huignard et al. |

OTHER PUBLICATIONS

International Search Report issued Jun. 2, 2010 in PCT/FR10/050097 filed Jan. 22, 2010.

U.S. Appl. No. 13/384,406, filed Jan. 17, 2012, Schiavoni, et al.

* cited by examiner

TRANSPARENT GLASS SUBSTRATE AND PROCESS FOR MANUFACTURING SUCH A SUBSTRATE

CROSS REFERENCE TO RELATED APPLICATIONS

The present application is the national stage of international application PCT/FR2010/050097, filed on Jan. 22, 2010, published as WO 2010/084290 on Jul. 29, 2010, the text of which is incorporated by reference, and claims the benefit of the filing date of French Application No. 0950422, filed on Jan. 23, 2009, the text of which is also incorporated by reference.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF THE MATERIAL ON THE COMPACT DISC

Not Applicable.

BACKGROUND OF THE INVENTION

1. Field of the Invention

The present invention relates to a transparent glass substrate comprising at least one face which is provided with a plurality of geometric features in relief relative to a general plane of the face. The invention also relates to a module for collecting energy originating from radiation incident on the module, in particular solar radiation, comprising such a substrate as the front substrate of the module. Moreover, the invention relates to a process for manufacturing such a transparent glass substrate.

Within the meaning of the invention, a module for collecting energy originating from radiation may be, in particular, a photovoltaic solar module, capable of converting the energy originating from solar radiation into electrical energy, or a thermal solar module, capable of converting energy originating from solar radiation into thermal energy collected in a heat transfer fluid.

2. Description of the Related Art Including Information Disclosed Under 37 CFR 1.97 and 1.98

Conventionally, a module for collecting energy originating from solar radiation comprises a front substrate, or a substrate having a glass function, which provides a mechanical protection for the energy conversion elements, namely the photovoltaic cell or cells in the case of a photovoltaic module, while allowing a good transmission of the solar radiation to these energy conversion elements. The front substrate may especially be constituted of a transparent glass, preferably clear or extra-clear glass, having a very low content of iron oxides, such as the glass "DIAMANT" or the glass "ALBARINO" sold by Saint-Gobain Glass.

One strategy for increasing the energy conversion efficiency of an energy-collecting module consists of improving the transmission properties of the front substrate, by limiting the reflection of the radiation incident on the module at the interface between the air and the front substrate. For this purpose, it is known to texture at least the front face of the substrate, intended to be positioned on the side on which radiation is incident on the module, by providing it with a plurality of geometric features in relief that are concave or convex relative to a general plane of this face. Within the meaning of the invention, the general plane of a textured face is the plane containing the points of this face which do not form part of the features in relief or, in the case of contiguous features, the points at the junctions between the features in relief. With a view to obtaining an effective improvement of its transmission properties, the substrate is advantageously provided with a sloping texturing, in particular a texturing which has a high aspect ratio, defined as being the ratio of the thickness of the features in relief constituting the texturing to the width of these features, especially an aspect ratio of greater than 0.1. The features in relief may be pyramids or cones, or else features that have a favored longitudinal direction, such as grooves or ribs. However, the efficiencies of modules that integrate such textured front substrates remain limited.

It is these drawbacks that the invention intends more particularly to solve by proposing a transparent glass substrate which, when it is integrated as a front substrate in a module for collecting energy originating from radiation, in particular solar radiation, has optimized transmission properties of the radiation incident on the substrate to the energy conversion elements of the module, thus enabling an improvement of the efficiency of this module compared to modules from the prior art, while preferably having a manufacturing process that is simple and is capable of being easily industrialized.

BRIEF SUMMARY OF THE INVENTION

For this purpose, one subject of the invention is a transparent glass substrate comprising at least one face which is provided with a texturing formed by a plurality of geometric features in relief relative to a general plane of this face, this texturing being adapted in order to ensure a transmission of radiation through the substrate, towards a subjacent element in contact with the substrate, greater than that obtained with radiation through an identical substrate that only differs in that it lacks texturing, characterized in that said face of the substrate is also provided with an antireflection layer having a refractive index between the refractive index of air and the refractive index of the glass, the antireflection layer being an etched superficial portion of the glass substrate on the side of said face, which comprises a structure based on silica and voids having a characteristic dimension between 0.5 nanometers and 50 nanometers.

Within the meaning of the invention, a transparent glass substrate is a substrate that is transparent at least in certain wavelength ranges of the solar spectrum, in particular in the wavelength ranges of use for the energy conversion elements of the module in which the substrate is intended to be integrated. By way of example, in the case of a photovoltaic module comprising photovoltaic cells based on polycrystalline silicon, the substrate is advantageously transparent in the wavelength range between 400 nm and 1200 nm. Furthermore, within the meaning of the invention, the term "layer" denotes a superficial layer of the substrate, that is to say an etched out or "skeletonized" layer of the substrate which is an integral part of the substrate, and not a layer added on the substrate.

According to other advantageous features of a substrate according to the invention:

for each feature in relief, the ratio of the thickness to the width of the feature is greater than or equal to 0.1, preferably greater than or equal to 0.25;

the refractive index of the antireflection layer at 600 nm is less than 1.3, preferably of the order of 1.22-1.23;

the thickness of each feature in relief is greater than 10 micrometers, preferably greater than 100 micrometers;

the thickness of the antireflection layer is between 30 nanometers and 1 micrometer, preferably between 80 nanometers and 200 nanometers;

the features in relief are distributed randomly over the face of the substrate;

the features in relief are contiguous;

the features in relief are pyramids or cones having non-zero apex half-angles;

the base of each feature in relief is inscribed within a circle having a diameter of less than or equal to 5 millimeters;

the features in relief are grooves or ribs;

any apex half-angle of the features in relief is less than 70°, preferably between around 25° and 50°;

the antireflection layer is a superficial portion of the glass substrate on the side of said face that has undergone a treatment using an acid solution that is supersaturated with silica;

the antireflection layer is a superficial portion of the glass substrate on the side of said face that has undergone a treatment using a solution of fluosilicic acid which is supersaturated with silica in a proportion between around 0 and 3 millimoles per liter above the silica saturation point.

Another subject of the invention is a module for collecting energy originating from radiation incident on the module, in particular solar radiation, comprising a substrate as described above as the front substrate of the module, the face of the substrate which is provided with features in relief and with the antireflection layer being the front face of the module.

Another subject of the invention is a process for manufacturing a transparent glass substrate, comprising successive steps of:

forming, on at least one face of a transparent glass plate, a texturing comprising a plurality of geometric features in relief relative to a general plane of this face, this texturing being adapted in order to ensure a transmission of radiation through the plate, towards a subjacent element in contact with the plate, greater than that obtained with an identical plate that only differs in that it lacks texturing;

immersing the glass plate, at least on the side of the face comprising the features in relief, in an acid solution that is supersaturated with silica.

Advantageously, the features in relief on said face are formed by rolling of the glass plate.

Furthermore, the solution in which the glass plate is immersed is advantageously a solution of fluosilicic acid which is supersaturated with silica in a proportion between around 0 and 3 millimoles per liter above the silica saturation point.

BRIEF DESCRIPTION OF THE SEVERAL VIEWS OF THE DRAWINGS

The features and advantages of the invention will appear in the description which follows of one embodiment of a substrate and a module according to the invention, given solely by way of example and with reference to the appended drawings in which.

DETAILED DESCRIPTION OF THE INVENTION

Figure 1:
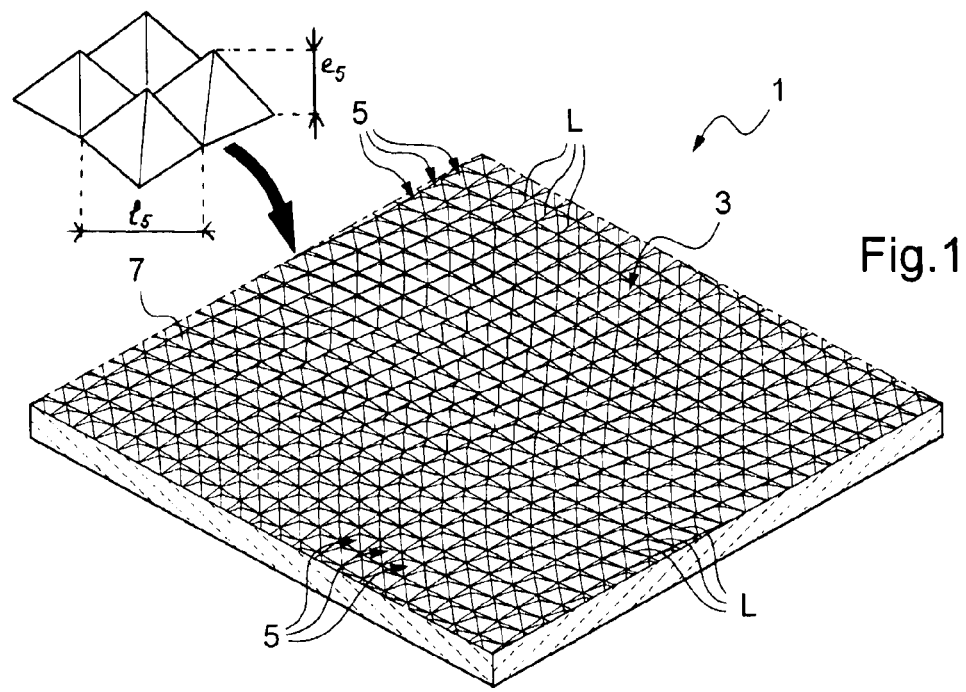
FIG. 1 is a perspective view of a substrate in accordance with the invention.

The substrate 1 according to the invention, represented in FIG. 1, is a rolled and patterned extra-clear transparent glass plate, comprising on one of its faces 3 a convex texturing formed by an assembly of pyramidal features 5. An example of such a glass is the glass "ALBARINO P" sold by Saint-Gobain Glass. The texturing of the substrate 1 has a high aspect ratio, defined as being the ratio of the thickness $e_5$ of the features 5 to the width $l_5$ of the features 5, so as to give the substrate 1 improved radiation transmission properties relative to a glass plate of the same glass composition as the substrate 1, but that is not textured. In the example represented in FIG. 1, the face 3 of the substrate 1 comprises a plurality of contiguous pyramidal features 5, having a parallelogram base with 2 mm sides and an apex half-angle of 45°. The width of each pyramidal feature 5 is defined as the diameter of the smallest circle in which the base of the feature 5 is inscribed. Each feature 5 has a thickness $e_5$ of 1 mm that protrudes relative to a general plane $\pi$ of the face 3, so that the total thickness $e_1$ of the substrate 1 with its texturing is 4 mm. The aspect ratio of the texturing formed by the features 5 has a value of 0.5.

As can clearly be seen in FIG. 1, the pyramidal features 5 of the face 3 are aligned along wavy lines L. Within the meaning of the invention, the alignment lines L of the features 5 are the lines formed by the successive identical sides of pyramidal features positioned adjacent to one another, in rows. In the embodiment represented in FIG. 1, the longitudinal directions of the sides of the successive pyramidal features 5 along each alignment line L are modified in steps. Thus, superposed on the general or overall direction of the alignment lines L is a variation of the direction of the sides of the individual pyramidal features, which produces the waviness of the alignment lines L. As explained in application WO-A-2006134301, such a random distribution of the pyramidal features 5 on the face 3 makes it possible to reduce the average absolute intensity of the reflection on the substrate 1 for each individual angle of reflection and to avoid marked transitions between reflecting directions and non-reflecting directions. This results in a more uniform appearance of the substrate 1 and a minimization of the risks of glare.

Advantageously, the texturing of the face 3 is carried out by rolling of the flat surface of a glass plate, heated at a temperature at which it is possible to deform its surface, using a solid object such as a metal roll that has, at its surface, the reverse shape of the texturing to be formed. Depending on the shape of the desired texturing, the features formed by rolling do not necessarily have perfect geometrical shapes. In particular, in the case of the pyramidal features 5, the apex and the edges of each feature are rounded, as shown schematically in FIG. 4.

According to one variant that is not represented, the texturing of a substrate according to the invention may be formed by an assembly of features other than pyramidal features. The features of a substrate according to the invention may in particular be cones, or elongated features of the groove or rib type. When the texturing of the substrate is formed by pyramidal or conical features, these features advantageously have a polygonal base, in particular a triangular, square, rectangular, parallelogram, hexagonal or octagonal base.

Preferably, the features are contiguous. Features are said to be contiguous when they touch at at least one part of their surface. Cones may be contiguous if the circles which constitute their base touch. It is preferred that the features are contiguous since the surface of the plate is thus more textured and the transmission of radiation is further improved. Certain features do not allow a complete joining or contiguity between the features. This is especially the case when the feature is a cone, since even when the circles of the bases of the cones touch, a certain surface area remains between the circles that is not part of the features. The expression "completely contiguous" is understood to mean the fact that the contour of the base of a feature is also entirely part of the contours of its neighboring features. Certain features may be completely contiguous, so that the whole of the surface of the plate is part of at least one feature. In particular, pyramids having a quadrilateral or hexagonal base may be completely contiguous if they are identical.

The textured face 3 of the substrate 1 also comprises an antireflection layer 7, which is a layer of porous silica having a thickness $e_7$ of around 100 nm and a refractive index at 600 nm of less than 1.3, preferably of the order of 1.22-1.23. As shown schematically in FIG. 4, the layer 7 is a superficial portion of the substrate 1 on the side of the face 3, which is an integral part of the substrate 1. The layer 7 results from an etching or skeletonization treatment of the constituent glass of the substrate 1 using a solution of fluosilicic acid $H_2SiF_6$ supersaturated with silica. Thus, the antireflection layer 7 is a porous superficial portion, hollowed out in the glass structure of the substrate 1 on the side of face 3, which comprises a skeleton of silica, and voids (or pores) having an average characteristic dimension of the order of 0.5 nm to 50 nm.

The preparation of the substrate 1 provided with the layer 7 involves the immersion of a glass plate 2, textured on one of its faces 3 as described previously, in the aforementioned acid solution at least on the side of its textured face 3. In practice, the etching treatment is carried out by passing the textured glass plate 2 into various successive baths, including a bath of the aforementioned acid solution.

Figure 2:
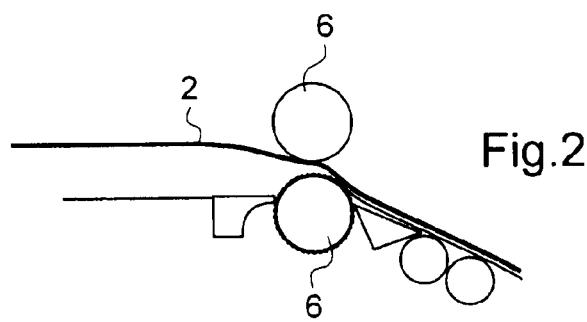
FIG. 2 is a schematic diagram of a first step of the process for manufacturing the substrate of FIG. 1.

More specifically, a process for manufacturing the substrate 1 in accordance with the invention, illustrated in the schematic diagrams of FIGS. 2 and 3, comprises steps as described below.

Firstly, the random pyramidal texturing previously described is formed on one face 3 of a plate 2 of extra-clear transparent glass. By way of example, and as shown in FIG. 2, this texturing may especially be formed by rolling of the flat surface of the plate 2, by heating the glass at a temperature at which it is possible to deform its surface and by deforming this surface by means of metal rolls 6 having, at their periphery, a pyramidal texturing complementary to the texturing to be imprinted on the glass plate 2. As a variant, the texturing may be carried out by techniques other than rolling, such as thermoforming or engraving.

Optionally, a chemical or thermal toughening of the glass plate 2 may be carried out after the texturing has been produced. In particular, the subsequent etching treatment of the textured plate 2 may be applied either to toughened glass or non-toughened glass.

At the same time as, prior to, or subsequent to the texturing of the glass plate 2, a solution of fluosilicic acid $H_2SiF_6$, supersaturated with silica in a proportion ranging from 0 to 3 millimoles per liter above the silica saturation point, is prepared.

The glass plate 2 is then immersed, at least on the side of its textured face 3, in a bath of the previously prepared solution of fluosilicic acid which is supersaturated with silica. The acid solution acts on the glass plate 2 so as to produce, on the side of the textured face 3, a hollowed out or "skeletonized" layer which is the antireflection layer 7, comprising a network of silica and voids between the molecules of the network, having a characteristic dimension of the order of 0.5 nm to 50 nm. The thickness $e_7$ of the layer 7 is determined by the immersion time of the glass plate 2 in the bath of fluosilicic acid supersaturated with silica.

Preferably, the etching treatment is carried out at a temperature of the fluosilicic acid solution between around 25° C. and 80° C. The speed of the etching treatment of the glass plate 2 increases with temperature. It is also advantageous to provide a means of stirring the fluosilicic acid solution so as to obtain an antireflection etched out layer 7 that is as uniform as possible.

Optionally, prior to its immersion in the bath of fluosilicic acid supersaturated with silica, the textured glass plate 2 may be cleaned, at least on its textured face 3, especially by means of a decontamination powder and/or by immersion in a pre-cleaning bath comprising a material suitable for acting as a solvent for the silica, such as a bath of sodium hydroxide or of hydrofluoric acid. This pretreatment makes it possible to remove surface pollutants that can be present on the textured face 3 due to a prolonged exposure of the glass plate 2 to the open air. This pre-cleaning contributes to the formation of an antireflection hollowed out layer 7 that is as uniform as possible.

Figure 3:
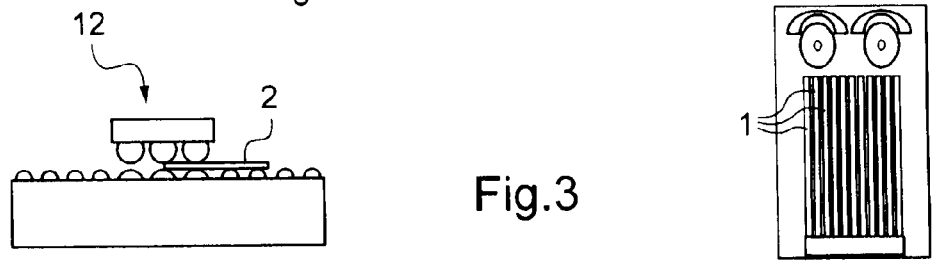
FIG. 3 is a schematic diagram of a second step of the process for manufacturing the substrate of FIG. 1.
Figure 3:
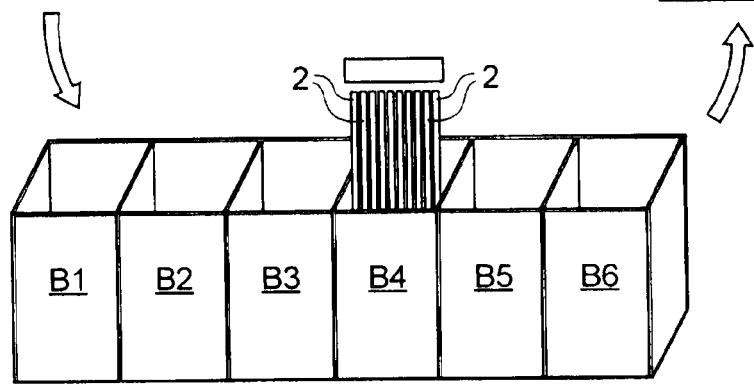

By way of example and as shown in FIG. 3, the overall process for treatment of the textured glass plate 2 for the formation of the antireflection layer 7 may involve, after the cleaning of the textured plate 2 in a washer 12, the passage of the textured plate 2 into at least six successive baths. As represented in FIG. 3, these baths comprise a bath B1 of sodium hydroxide or of hydrofluoric acid for the pre-cleaning of the plate 2, at least two rinsing baths B2 and B3, a bath B4 of fluosilicic acid supersaturated with silica for the etching treatment of the plate 2, then again at least two rinsing baths B5 and B6. By way of example, the rinsing of the plate before and after the etching treatment may be carried out in demineralized water. The substrate 1 thus obtained is then passed into a drier 14, that can be seen on the right-hand side of FIG. 3.

Advantageously, the process for treatment of the glass plate 2 for the formation of the antireflection layer 7 is completely automated, as is the process for the prior texturing of the plate 2. Such an automation guarantees a good quality and a good reproducibility of the surface properties of the face 3 of the substrate 1 according to the invention. Moreover, by virtue of this automation, it is possible to set up a continuous manufacturing process of substrates 1 according to the invention. In particular, the texturing process and the treatment process for the formation of the antireflection layer 7 may be easily integrated at the end of existing glass substrate production lines so that the treatment process for the formation of the antireflection layer 7 is carried out directly after the texturing process.

Within the context of a continuous manufacturing process, the amount of silica in the bath B4 of fluosilicic acid supersaturated with silica must be regularly controlled and adjusted in order to guarantee the effective formation of the antireflection etched out layer 7. Indeed, as explained in the U.S. Pat. No. 2,490,662, the formation of the superficial layer 7 depends on the amount of silica present in the fluosilicic acid solution above the silica saturation point of this solution. In particular, the ability of a solution of fluosilicic acid supersaturated with silica to "skeletonize" the surface of a specific glass is determined by a factor known as the "solution potency", which is linked to the amount of silica in excess present in the solution. Thus, a solution too high in solution potency tends to uniformly dissolve a layer of the constituent glass of the glass plate, whereas a solution too low in solution potency tends to deposit a film of silica on the glass plate without attacking its surface.

A solution of fluosilicic acid supersaturated with silica having a suitable potency for the etching treatment of a glass plate has an excess of silica between around 0 and 3 millimoles per liter above the silica saturation point, the exact value depending on the composition of the constituent glass of the plate to be treated. The solution potency of a solution of fluosilicic acid supersaturated with silica tends to increase over time. Advantageously, it is possible to reduce the solution potency by the addition of boric acid $H_3BO_3$ to the solution of fluosilicic acid. Consequently, it is easy, for example within the context of a continuous manufacturing process of the substrate 1 according to the invention, to set up a regular control of the value of the solution potency of the bath B4 of fluosilicic acid supersaturated with silica intended for the etching treatment, and to adjust this value by the addition of boric acid to the bath B4 each time the value of the solution potency deviates relative to its appropriate value.

Figure 4:
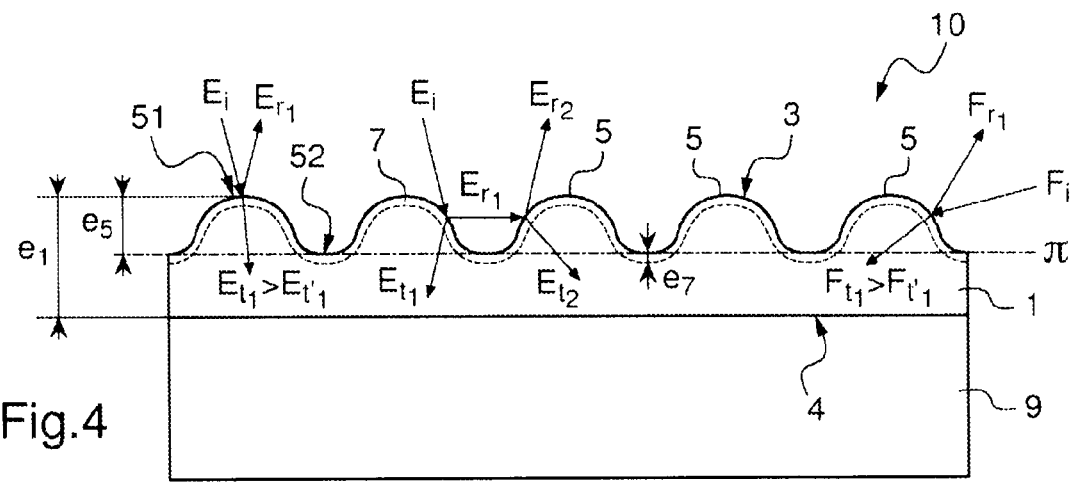
FIG. 4 is a partial and schematic cross section of a photovoltaic module in accordance with the invention comprising the substrate of FIG. 1 as the front substrate.

Represented partially and schematically in FIG. 4 is a photovoltaic module 10 according to the invention, comprising the substrate 1 as the front substrate. As shown in this figure, the face 3 of the substrate 1, which is provided with the texturing 5 and with the antireflection layer 7, is on the side on which the radiation is incident on the module 10. In this embodiment, the face 4 of the substrate 1 opposite the front face 3 is on the whole flat, free from an antireflection layer and positioned facing one or more photovoltaic cells 9. As a variant, the rear face 4 of the substrate 1 may comprise an antireflection layer that has been hollowed out by etching, similarly to the layer 7, the presence of such a layer on the face 4 having no impact on the efficiency of the module 10 insofar as the constituent material of the layer subjacent to the substrate 1, formed by the front electrode of the cell or cells 9 or by an optional lamination interlayer, fills the voids of the layer that has been hollowed out by etching.

The absorber layer of the or each cell 9, suitable for ensuring the conversion of the energy originating from the radiation incident on the cell into electrical energy, may in particular be a thin film based on amorphous or microcrystalline silicon, or based on cadmium telluride. In this case, in a known manner, the or each thin film cell 9 comprises a successive stack, starting from face 4 of the substrate 1:

of an electrically conductive transparent layer, especially based on a transparent conductive oxide (TCO), which forms a front electrode of the cell;

of the absorber layer; and of an electrically conductive layer which forms a rear electrode of the cell.

In practice, the or each cell 9 is immobilized between the front substrate 1 and a rear substrate, not represented, of the module 10.

As a variant, the absorber layer of the or each cell 9 may be a thin film of a chalcopyrite compound comprising copper, indium and selenium, known as a CIS absorber layer, optionally added to which is gallium (CIGS absorber layer), aluminum or sulfur. In this case, the or each thin film cell 9 comprises a stack similar to that described above, a polymer lamination interlayer, not represented, also being positioned between the front electrode of the cell 9 and the face of the substrate 1 in order to guarantee a good cohesion of the module 10 when assembled. The lamination interlayer may in particular be constituted of polyvinyl butyral (PVB) or of ethylene vinyl acetate (EVA).

According to yet another variant, the or each cell 9 may be constituted from polycrystalline or monocrystalline silicon wafers forming a p-n junction.

Figure 5:
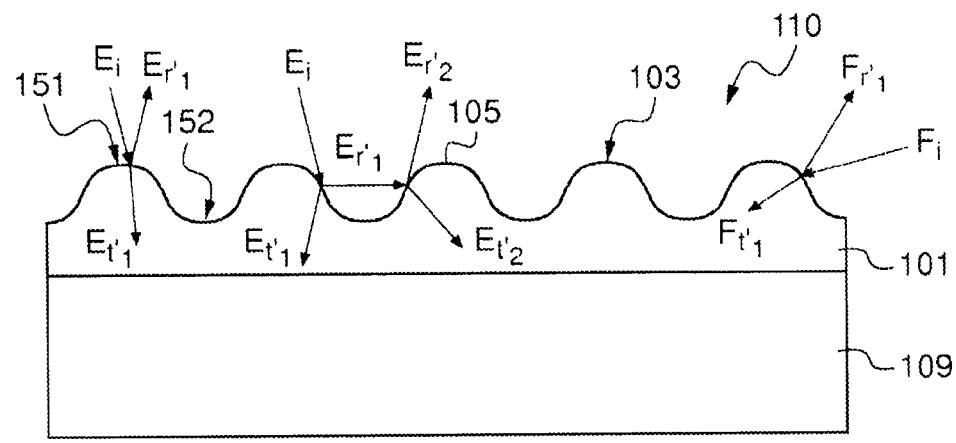
FIG. 5 is a cross section similar to FIG. 4 for a photovoltaic module from the prior art comprising a textured front substrate of the same thickness and of the same glass matrix as the substrate of FIG. 1, but that lacks an antireflection layer.
Figure 6:
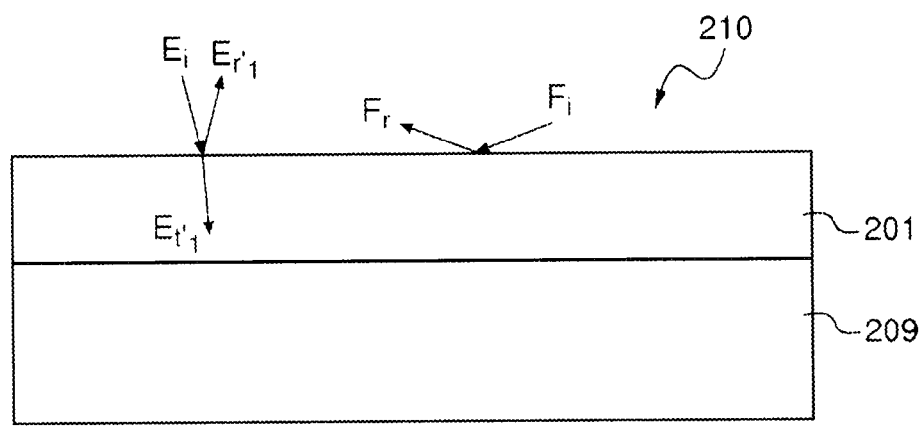
FIG. 6 is a cross section similar to FIG. 4 for a photovoltaic module from the prior art comprising a front substrate of the same thickness and of the same glass matrix as the substrate of FIG. 1, but that lacks both texturing and an antireflection layer.

Represented respectively in FIGS. 5 and 6 are a photovoltaic module 110 and a photovoltaic module 210 from the prior art. Each module 110 or 210 comprises, similarly to the module 10 according to the invention, a front substrate 101 or 201 made of extra-clear glass of the same composition as the constituent glass of the substrate 1 and having the same thickness as the substrate 1, which surmounts one or more photovoltaic cells 109 or 209 similar to the photovoltaic cells 9 of the module 10. The substrate 101 of the module 110 comprises a front face 103, intended to be on the side on which radiation is incident on the module 110, which is provided with a pyramidal texturing 105 similar to that of the substrate 1. However, the substrate 101 differs from the substrate 1 according to the invention in that the front face 103 lacks an antireflection layer. The substrate 201 of the module 210 is itself a substrate lacking both texturing and an antireflection layer.

Figure 7:
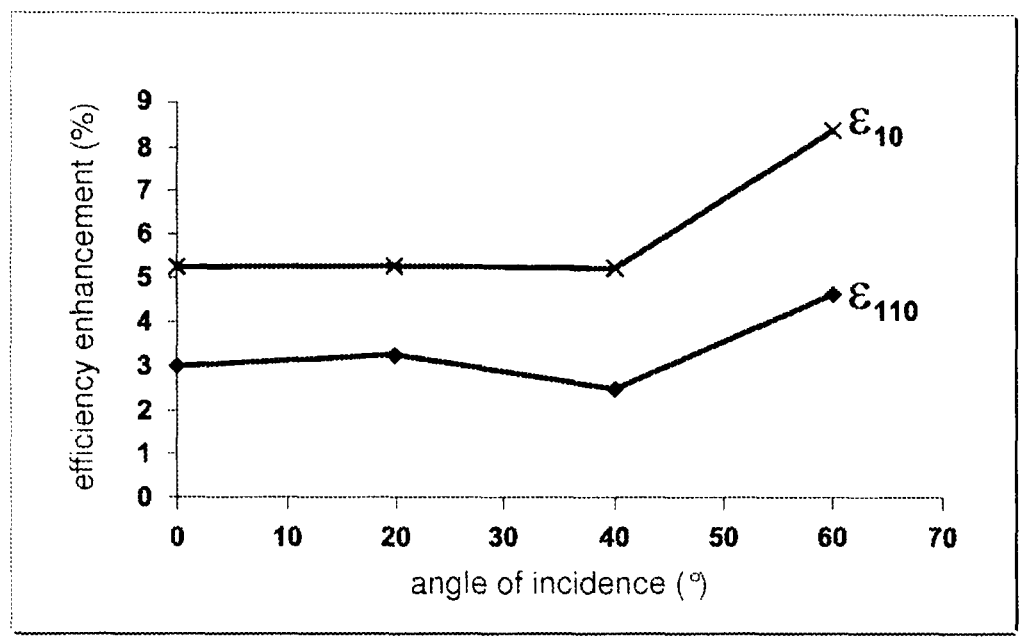
FIG. 7 is a graph showing the experimental curves of enhancement, relative to the efficiency of the photovoltaic module of FIG. 6, of the efficiency of the photovoltaic module of FIG. 4, on the one hand, and of the photovoltaic module of FIG. 5, on the other hand, as a function of the angle of incidence of the radiation on the module.
Figure 8:
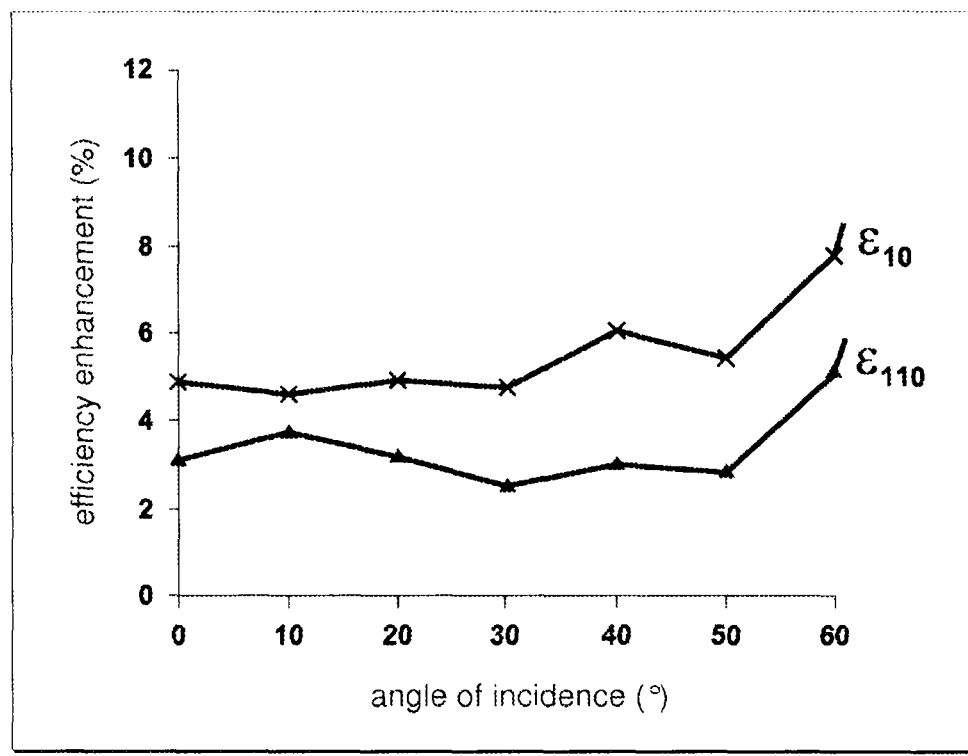
FIG. 8 is a graph showing the curves, obtained by optical simulation of the surface structure of the front substrates of the modules of FIGS. 4 to 6, of enhancement, relative to the efficiency of the photovoltaic module of FIG. 6, of the efficiency of the photovoltaic module of FIG. 4, on the one hand, and of the photovoltaic module of FIG. 5, on the other hand, as a function of the angle of incidence of the radiation on the module.

FIGS. 7 and 8 illustrate the enhancement $\epsilon_{10}$ of the efficiency of the module 10 and the enhancement $\epsilon_{110}$ of the efficiency of the module 110 relative to the efficiency of the module 210, as a function of the angle of incidence of radiation on the module, expressed as integrated current density and determined experimentally, for FIG. 7, and by simulation, for FIG. 8.

As emerges from the experimental data of FIG. 7, the enhancement $\epsilon_{110}$ of the efficiency of the module 110 relative to the efficiency of the module 210 is between 3% for an angle of incidence of 0° and 5% for an angle of incidence of 60°, whereas the increase $\epsilon_{10}$ of the efficiency of the module 10 according to the invention relative to the efficiency of the module 210 is between 5% for an angle of incidence of 0° and 8% for an angle of incidence of 60°. Thus, the module 10, which comprises the substrate 1 according to the invention as the front substrate, has an efficiency enhancement at least 2% greater than the efficiency enhancement of the module 110 from the prior art comprising a front substrate 101 that is textured but lacks an antireflection layer.

These experimental data are in agreement with the results shown in FIG. 8, obtained by optical simulation of the surface structures of the substrates 1, 101 and 201.

The assumptions for setting up this simulation are the following:
  substrates 1, 101, 201 constituted of one and the same glass composition "ALBARINO" as sold by Saint-Gobain Glass and having one and the same thickness of 4 mm;
  energy distribution of incident radiation on the module 10, 110, 210 corresponding to a standard solar spectrum;
  evaluation of the efficiency of the photovoltaic cells 9, 109, 209 as a function of the wavelength of the incident radiation, which corresponds to the ratio of the number of electrons collected to the number of photons which reach the cell, taking as a reference, a photovoltaic cell based on polycrystalline silicon; however, the results can be transposed to other types of photovoltaic cells, insofar as the improvement of the transmission properties of a substrate resulting from the texturing of this substrate and from the presence of an antireflection layer on the substrate do not significantly depend on the wavelength of the radiation incident on the substrate.

The curves of FIG. 8 confirm the experimental results of FIG. 7, namely the fact that the enhancement $\epsilon_{10}$ of the efficiency of the module 10 according to the invention relative to the efficiency of the module 210 is greater, by a proportion of around 2% for an angle of incidence of 0° and of around 3% for an angle of incidence of 60°, than the enhancement $\epsilon_{110}$ of the efficiency of the module 110 having a substrate that is textured but that lacks an antireflection layer.

An analysis of the principles at the root of the enhancement of the transmission of radiation through a textured substrate relative to a non-textured substrate, to a subjacent element in contact with the substrate such as a photovoltaic cell 9 or a lamination interlayer, makes it possible to theoretically explain why it is possible to combine the effects of the texturing of the front face of the substrate, on the one hand, and of the antireflection layer present on the front face of the substrate, on the other hand, in order to improve the transmission properties of this substrate.

The first principle at the root of the enhancement of the transmission for a textured substrate is the trapping of the incident radiation due to multiple reflections on the features in relief of the substrate. As emerges from a comparison of FIG. 4 or 5, on the one hand, and of FIG. 6, on the other hand, for incident rays $E_i$ on the substrate 1, 101 having low angles of incidence, multiple reflections take place on the features 5, 105 in relief of the textured face 3, 103, which offer the radiation a larger number of possibilities $E_{t1}$, $E_{t2}$ of entering into the substrate, resulting in a reduction in reflection on the textured face 3, 103 of the substrate 1, 101 relative to the flat face 203 of the substrate 201. These multiple reflections are even greater when the features 5, 105 are contiguous and sloping, that is to say that the texturing of the substrate 1, 101 has a high aspect ratio.

However, insofar as the features 5, 105 of the textured face 3, 103 are not of perfectly pyramidal shape, but on the contrary are rounded, this multiple reflection phenomenon does not take place in all the regions of the face 3, 103. In particular, in the furthest regions corresponding to the apices 51, 151 and to the valleys 52, 152 of the texture 5, 105, the aforementioned phenomenon of trapping the incident radiation cannot take place, as illustrated by the arrows $E_{r1}$ and $E_{r'1}$ located on the left of FIGS. 4 and 5. Consequently, in these furthest regions 51, 151 and 52, 152, the presence of an antireflection layer such as the layer 7 increases the transmission of the incident radiation at the air/glass interface. The effect of the antireflection layer is however lower for a textured substrate, compared to a flat substrate, since in the regions where trapping of the incident radiation occurs, the effect of the antireflection layer is negligible.

An evaluation of the surface of the regions in which the antireflection layer 7 has an effect of increasing the transmission of incident rays having low angles of incidence, is of the order of two thirds of the total surface of the substrate 1, which corresponds to the result, both experimental and modeled, according to which the difference (2%) between the enhancement $\epsilon_{10}$ of the efficiency of the module 10 for an angle of incidence of 0° (5%) and the enhancement $\epsilon_{110}$ of the efficiency of the module 110 for an angle of incidence of 0° (3%) is approximately equal to two thirds of the enhancement $\epsilon_{110}$ of the efficiency of the module 110 for an angle of incidence of 0° (3%).

Furthermore, the radiation reflected after it has entered into the substrate 1, 101, at the interface between the substrate and the subjacent layer formed by the front electrode of the cells 9, 109 or an optional lamination interlayer, is trapped by reflection on the faces of the features 5, 105, so that a larger portion of the radiation is transmitted through the substrate. The losses in reflection are thus reduced further by virtue of this second trapping of the radiation. As far as this second trapping is based on a phenomenon of total internal reflection, the corresponding transmission enhancement is not influenced, however, by the presence or absence of an antireflection layer at the front face 3, 103 of the substrate.

The second principle at the root of the enhancement of the transmission for a textured substrate is the fact that, for incident rays $F_i$ on the substrate having high angles of incidence, close to 90°, the radiation has lower angles of incidence on the faces of the features 5, 105 than on a flat surface. For example, with pyramidal features 5, 105 having apex half-angles of 45°, even if they are rounded, the incident rays $F_i$ having an angle of incidence that varies between 0 and 90° on a flat surface encounter the surface of the texture 5, 105 with an angle of incidence between −45° and +45°. As the range of high angles of incidence (close to 90°) favors reflection at the air/glass interface, the replacement of the range of angles of incidence of 0 to 90° by the range −45 to +45° is accompanied by a substantial reduction in reflection. This effect of reducing the reflection for high angles of incidence is even more pronounced since the features 5, 105 are sloped, that is to say that the texturing of the substrate 1, 101 has a high aspect ratio. The presence of the antireflection layer 7 also plays a role in improving the transmission of these rays having high angles of incidence, since the phenomenon of trapping the radiation does not take place for these rays. Indeed, as shown by the arrows $F_{r1}$ and $F_{r'1}$ located on the right of FIGS. 4 and 5, a ray having a high angle of incidence, once reflected, is lost for good.

From this theoretical observation according to which it is possible to combine the effects of a texturing and of an antireflection layer present on the front face of a substrate in order to optimize the transmission properties of this substrate, even though these effects may at first appear conflicting or at least not compatible, especially for low angles of incidence if the rounded shape of the constituent features of the texturing is not considered, the invention provides a substrate that combines, on one of its faces, a texturing and an antireflection layer formed by an etching treatment. As emerges from the preceding examples, such a substrate, when it is integrated into a photovoltaic module as a front substrate, substantially improves the efficiency of this module compared to the modules of the prior art.

The constituent features 5 of the texturing of a substrate according to the invention have a thickness $e_5$, as a projection or as a hollow relative to the general plane $\pi$ of the face of the substrate, greater than 10 micrometers, preferably greater than 100 micrometers, more preferably of the order of a millimeter. The antireflection layer 7 of a substrate according to the invention has, itself, a thickness $e_7$ between 30 nanometers and 1 micrometer, preferably between 80 nanometers and 200 nanometers.

The selection of the etching treatment for the formation of the antireflection layer of a substrate according to the invention is particularly advantageous, since the acid attack of the structure of the constituent glass of the substrate, characteristic of the etching treatment, takes place both on a flat glass surface and on a textured, in particular highly textured, glass surface. This results in a simple, reliable and easily automated process for manufacturing a substrate in accordance with the invention, this process possibly being easily adapted in order to operate continuously within an industrial context.

Furthermore, the antireflection layer produced by the etching treatment, combined with the texturing, gives the substrate according to the invention improved transmission properties of an incident radiation on the substrate regardless of the orientation of this incident radiation, that is to say for a wide range of angles of incidence of the incident radiation.

Moreover, as the antireflection layer produced by the etching treatment is an integral part of the substrate according to the invention, it cannot be removed from the surface of the substrate, unlike other types of antireflection layers known from the prior art. Hence, the antireflection layer of a substrate in accordance with the invention has an excellent mechanical strength, thermal resistance and chemical resistance, and in particular a good long-term resistance to external climatic conditions, which is advantageous when the substrate is integrated into a module for collecting solar energy.

The invention is not limited to the examples described and represented. In particular, as mentioned previously, the texturing of a substrate in accordance with the invention may be formed by an assembly of features other than pyramidal features, especially by an assembly of conical features, or of elongated features of the groove or rib type. In all cases, the texturing of a substrate in accordance with the invention is sufficiently deep and sloping. In particular, whatever the profile of the features in relief of the texturing, the apex half-angle of each feature is advantageously less than 70°, preferably between around 25° and 50°, and the aspect ratio of the texturing, that is to say the ratio of the thickness to the width of each feature, is advantageously greater than or equal to 0.1. Such a sloping texturing is suitable for giving the substrate improved radiation transmission properties. When these features are pyramidal or conical, the width of each feature is defined as the diameter of the smallest circle in which the base of the feature is inscribed. When the features are elongated features of the groove or rib type, the width of each feature is defined as the transverse dimension of the feature, perpendicular to the longitudinal direction of the feature.

The texturing of a substrate according to the invention may also be a concave texturing, instead of a convex texturing, the features in relief then being hollowed out relative to the general plane of the textured face of the substrate. Furthermore, the features in relief of a substrate according to the invention are either contiguous or non-contiguous. A random distribution of the features on the textured face of the substrate, if it is advantageous, is also not obligatory. In particular, the textured glass "ALBARINO P" and the textured glass "ALBARINO G" sold by Saint-Gobain Glass are suitable for the manufacture of a substrate according to the invention via an etching treatment.

Furthermore, a substrate in accordance with the invention may be constituted of an extra-clear transparent glass having a composition other than the "ALBARINO" glass, for example an extra-clear transparent float glass such as the "DIAMANT" glass sold by Saint-Gobain Glass.

Furthermore, as mentioned previously, the texturing of a glass substrate according to the invention may be obtained by any suitable process, for example, by rolling, thermoforming or engraving.

A substrate in accordance with the invention may have an overall thickness different from that described previously. According to one variant, not represented, of the invention, a substrate in accordance with the invention may also comprise a texturing and/or an antireflection layer of etching type on both its faces, and not only on one of its faces. In practice, since the antireflection layer of etching type of a substrate according to the invention is formed by immersion of a glass plate in a bath, it may be easier to dip the entire plate in the bath, rather than only one of its faces, the substrate consequently comprising an antireflection layer of etching type on each of its faces, front and rear. In this case, when the substrate is integrated as the front substrate in a photovoltaic module, the constituent material of the layer subjacent to the substrate, formed by the front electrode of the cell or cells of the module or by a lamination interlayer, fills the voids of the antireflection layer of etching type present on the rear face of the substrate, so that the antireflection layer of the rear face does not modify the efficiency of the module.

Finally, a substrate in accordance with the invention having optimized transmission properties of incident radiation may be integrated into any type of module for collecting energy from radiation, photovoltaic solar modules being one advantageous application example.

The invention claimed is:

1. A transparent glass substrate, comprising at least one face which comprises a texturing formed by a plurality of geometric features in relief relative to a general plane ($\pi$) of said face,
   wherein the texturing is adapted in order to ensure a transmission of radiation through the substrate greater than the transmission of radiation through a substrate that is identical but lacks the texturing,
   wherein the features in relief are pyramids or cones having non-zero apex half-angles,
   wherein any apex half-angle of the features in relief is less than 70°,
   wherein, for each feature in relief, a ratio of a thickness to a width of the feature is greater than or equal to 0.1,
   wherein the face also comprises an antireflection layer having a refractive index between the refractive index of air and a refractive index of a glass of the substrate, and
   wherein the antireflection layer is an etched out superficial portion of the glass substrate on a side of the face, which comprises a structure comprising silica and voids, created by a treatment of said face in an acid solution that is supersaturated with silica.

2. The substrate of claim 1, wherein the refractive index of the antireflection layer at a wavelength of 600 nm is less than 1.3.

3. The substrate of claim 1, wherein a thickness of each feature in relief is greater than 10 micrometers.

4. The substrate of claim 1, wherein a thickness of the antireflection layer is between 30 nanometers and 1 micrometer.

5. The substrate of claim 1, wherein the features in relief are contiguous.

6. The substrate of claim 1, wherein a base of each feature in relief is inscribed within a circle having a diameter of less than or equal to 5 millimeters.

7. A module, comprising the substrate of claim 1 as the front substrate of the module,
- wherein the face of the substrate, which is provided with features in relief and the antireflection layer, is the front face of the module,
- wherein the module is suitable for collecting energy originating from radiation incident on the module.

8. The substrate of claim 1, wherein the refractive index of the antireflection layer at a wavelength of 600 nm is 1.22 to 1.23.

9. The substrate of claim 1, wherein a thickness of each feature in relief is greater than 100 micrometers.

10. The substrate of claim 1, wherein a thickness of the antireflection layer is between 80 nanometers and 200 nanometers.

11. The substrate of claim 1, wherein any apex half-angle of the features in relief is between 25° and 70°.

12. The substrate of claim 1, wherein any apex half-angle of the features in relief is between 25° and 50°.

13. The substrate of claim 1, wherein, for each feature in relief, a ratio of a thickness to a width of the feature is greater than or equal to 0.25.

14. A process for manufacturing a transparent glass substrate, comprising:
- forming, on at least one face of a transparent glass plate, a texturing comprising a plurality of geometric features in relief relative to a general plane ($\pi$) of the face,
- wherein the features in relief are pyramids or cones having non-zero apex half-angles,
- wherein any apex half-angle of the features in relief is less than 70°,
- wherein, for each feature in relief, a ratio of a thickness to a width of the feature is greater than or equal to 0.1, and
- wherein the texturing is adapted in order to ensure a transmission of radiation through the plate that is greater than the transmission of radiation through a plate that is identical but that lacks texturing; and
- immersing the glass plate, at least on the side of the face comprising the features in relief, in an acid solution that is supersaturated with silica, so as to create an antireflection layer which is an etched out superficial portion of the glass substrate on the side of the face, which comprises a structure comprising silica and voids and which has a refractive index between the refractive index of air and the refractive index of a glass of the substrate.

15. The process of claim 14, wherein the features in relief on the face are formed by rolling of the glass plate.

16. The process of claim 14, wherein the solution in which the glass plate is immersed is a fluosilicic acid solution which is supersaturated with silica in a proportion between around 0 and 3 millimoles per liter above the silica saturation point.

* * * * *